United States Patent
Sottke et al.

(10) Patent No.: US 9,017,809 B2
(45) Date of Patent: Apr. 28, 2015

(54) COATINGS FOR CUTTING TOOLS

(71) Applicant: Kennametal Inc., Latrobe, PA (US)

(72) Inventors: Volkmar Sottke, Mulheim/Ruhr (DE); Doris Lenk, Mulheim/Ruhr (DE); Hartmut Westphal, Dermbach/Rhon (DE); Hendrikus Van Den Berg, Venlo-Blerick (NL); Peter Leicht, Latrobe, PA (US); Mark Greenfield, Greensburg, PA (US); Yixiong Liu, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 148 days.

(21) Appl. No.: 13/750,252

(22) Filed: Jan. 25, 2013

(65) Prior Publication Data

US 2014/0208659 A1    Jul. 31, 2014

(51) Int. Cl.
*C23C 16/00* (2006.01)
*C23C 16/30* (2006.01)
*C23C 28/04* (2006.01)

(52) U.S. Cl.
CPC ............. *C23C 16/308* (2013.01); *C23C 28/042* (2013.01); *C23C 28/044* (2013.01)

(58) Field of Classification Search
CPC .................................................... C23C 16/308
USPC ............ 51/307, 309; 428/698, 699, 701, 702, 428/704
See application file for complete search history.

(56) References Cited

U.S. PATENT DOCUMENTS

| | | | |
|---|---|---|---|
| 4,357,382 A | * | 11/1982 | Lambert et al. ............... 428/698 |
| RE32,111 E | | 4/1986 | Lambert et al. |
| 4,587,174 A | | 5/1986 | Yoshimura et al. |
| 4,707,384 A | | 11/1987 | Schachner et al. |
| 4,714,660 A | | 12/1987 | Gates |
| 4,746,563 A | | 5/1988 | Nakano et al. |
| 4,749,629 A | * | 6/1988 | Sarin et al. .................... 428/701 |
| 4,749,630 A | | 6/1988 | Konig et al. |
| 4,943,450 A | | 7/1990 | Sarin |
| 4,950,558 A | | 8/1990 | Sarin |
| 5,071,696 A | | 12/1991 | Chatfield et al. |
| 5,075,265 A | | 12/1991 | Narula |
| 5,494,743 A | | 2/1996 | Woodard et al. |
| 5,500,279 A | | 3/1996 | Walter et al. |

(Continued)

FOREIGN PATENT DOCUMENTS

DE    3751689 D1         3/1996
EP        247630    * 12/1987

(Continued)

OTHER PUBLICATIONS

Moltrecht, Machine Shop Practice, International Press Inc., New York, New York (1981) pp. 199-204.

(Continued)

*Primary Examiner* — Archene Turner
(74) *Attorney, Agent, or Firm* — Matthew W. Gordon

(57) ABSTRACT

In one aspect, cutting tools are described having coatings adhered thereto. A coated cutting tool, in some embodiments, comprises a substrate and a coating adhered to the substrate, the coating comprising at least one composite layer deposited by chemical vapor deposition comprising an aluminum oxynitride phase and a metal oxide phase, the metal oxide phase including at least one oxide of a metallic element selected from Group IVB of the Periodic Table.

26 Claims, 4 Drawing Sheets

(56) References Cited

U.S. PATENT DOCUMENTS

| | | | |
|---|---|---|---|
| 5,618,626 | A | 4/1997 | Nagashima et al. |
| 5,665,431 | A | 9/1997 | Narasimhan |
| 5,709,907 | A | 1/1998 | Battaglia et al. |
| 5,722,803 | A | 3/1998 | Battaglia et al. |
| 5,750,267 | A | 5/1998 | Takase et al. |
| 5,827,570 | A | 10/1998 | Russell |
| 6,007,908 | A | 12/1999 | Reece et al. |
| 6,010,283 | A | 1/2000 | Henrich et al. |
| 6,022,174 | A | 2/2000 | Husvik et al. |
| 6,156,383 | A | 12/2000 | Ishii et al. |
| 6,161,990 | A | 12/2000 | Oles et al. |
| 6,183,846 | B1 | 2/2001 | Moriguchi et al. |
| 6,254,984 | B1 | 7/2001 | Iyori |
| 6,426,137 | B1 | 7/2002 | Oshika et al. |
| 6,528,180 | B1 | 3/2003 | Lee et al. |
| 6,652,922 | B1 | 11/2003 | Forester et al. |
| 6,660,371 | B1 * | 12/2003 | Westphal et al. ............. 428/702 |
| 6,811,880 | B1 | 11/2004 | Clough |
| 6,811,881 | B1 | 11/2004 | Clough |
| 6,835,446 | B2 | 12/2004 | Ueda et al. |
| 6,838,179 | B1 | 1/2005 | Legrand |
| 6,924,037 | B1 | 8/2005 | Joret et al. |
| 6,933,065 | B2 | 8/2005 | Arendt et al. |
| 7,005,189 | B1 | 2/2006 | Tachibana et al. |
| 7,087,295 | B2 | 8/2006 | Okada et al. |
| 7,244,520 | B2 | 7/2007 | Kumakura et al. |
| 7,258,927 | B2 | 8/2007 | Foltyn et al. |
| 7,322,776 | B2 | 1/2008 | Webb et al. |
| 7,410,707 | B2 | 8/2008 | Fukui et al. |
| 7,531,213 | B2 | 5/2009 | Bjormander |
| 7,541,102 | B2 | 6/2009 | Klippe et al. |
| 7,544,410 | B2 | 6/2009 | Lengauer et al. |
| 7,592,077 | B2 | 9/2009 | Gates, Jr. et al. |
| 7,608,335 | B2 | 10/2009 | Findikoglu et al. |
| 7,659,002 | B2 | 2/2010 | Coster et al. |
| 7,704,611 | B2 | 4/2010 | Coddet et al. |
| 7,727,934 | B2 | 6/2010 | Foltyn et al. |
| 7,736,728 | B2 | 6/2010 | Loboda et al. |
| 7,745,009 | B2 | 6/2010 | Decroupet et al. |
| 7,758,950 | B2 | 7/2010 | Moriguchi et al. |
| 7,782,569 | B2 | 8/2010 | Cheng et al. |
| 7,785,700 | B2 | 8/2010 | Okada et al. |
| 7,829,194 | B2 | 11/2010 | Brady et al. |
| 7,972,684 | B2 | 7/2011 | Hara et al. |
| 7,981,516 | B2 | 7/2011 | Labrousse et al. |
| 8,003,231 | B2 | 8/2011 | Yamamoto |
| 8,017,244 | B2 | 9/2011 | Hevesi |
| 8,080,323 | B2 | 12/2011 | Ban et al. |
| 8,119,226 | B2 | 2/2012 | Reineck et al. |
| 8,192,793 | B2 | 6/2012 | Sandberg et al. |
| 8,247,080 | B2 | 8/2012 | Iacovangelo et al. |
| 8,574,728 | B2 * | 11/2013 | Sottke et al. .................... 51/309 |
| 2003/0044652 | A1 | 3/2003 | Wang |
| 2003/0134039 | A1 | 7/2003 | Ross et al. |
| 2003/0175557 | A1 | 9/2003 | Anderson et al. |
| 2004/0076764 | A1 | 4/2004 | Forester et al. |
| 2004/0209126 | A1 | 10/2004 | Ziegler et al. |
| 2005/0008883 | A1 | 1/2005 | Takagi et al. |
| 2005/0025973 | A1 | 2/2005 | Slutz et al. |
| 2005/0064247 | A1 | 3/2005 | Sane et al. |
| 2006/0008676 | A1 | 1/2006 | Ebata et al. |
| 2006/0019118 | A1 | 1/2006 | Gates, Jr. et al. |
| 2006/0093758 | A1 | 5/2006 | Sakakura et al. |
| 2006/0127699 | A1 | 6/2006 | Moelle et al. |
| 2006/0159912 | A1 | 7/2006 | Haldeman |
| 2006/0182991 | A1 | 8/2006 | Tauchi et al. |
| 2006/0204772 | A1 | 9/2006 | Mukunoki et al. |
| 2006/0234064 | A1 | 10/2006 | Baubet et al. |
| 2006/0240266 | A1 | 10/2006 | Schicht et al. |
| 2007/0030569 | A1 | 2/2007 | Lu et al. |
| 2007/0172696 | A1 | 7/2007 | Tong et al. |
| 2008/0118762 | A1 | 5/2008 | Morimoto et al. |
| 2010/0062245 | A1 | 3/2010 | Martin et al. |
| 2010/0132762 | A1 | 6/2010 | Graham et al. |
| 2010/0242265 | A1 | 9/2010 | Wadley et al. |
| 2010/0247930 | A1 | 9/2010 | Zurbuchen |
| 2010/0255337 | A1 | 10/2010 | Langhorn |
| 2011/0016946 | A1 | 1/2011 | Brahmandam et al. |
| 2011/0102968 | A1 | 5/2011 | Choi et al. |
| 2011/0151173 | A1 | 6/2011 | Ramadas et al. |
| 2012/0144965 | A1 | 6/2012 | Engstrom |
| 2012/0207948 | A1 | 8/2012 | Lee |
| 2012/0237794 | A1 | 9/2012 | Sottke et al. |
| 2012/0258294 | A1 | 10/2012 | Leyder et al. |
| 2012/0258295 | A1 | 10/2012 | Leyder et al. |

FOREIGN PATENT DOCUMENTS

| | | | |
|---|---|---|---|
| EP | 704880 | A2 | 4/1996 |
| EP | 784101 | B1 | 8/1999 |
| EP | 732423 | B1 | 6/2001 |
| EP | 1724811 | A2 | 11/2006 |
| EP | 1247789 | B1 | 4/2008 |
| EP | 1705263 | B1 | 12/2009 |
| GB | 2 038 370 | A | 7/1980 |
| WO | 2005118505 | A1 | 12/2005 |
| WO | 2006005067 | A2 | 1/2006 |
| WO | 2006007728 | A1 | 1/2006 |
| WO | 2007001337 | A2 | 1/2007 |
| WO | 2007005925 | A1 | 1/2007 |
| WO | 2007018974 | A2 | 2/2007 |

OTHER PUBLICATIONS

Aste, Tool Engineers Handbook McGraw Hill Book Co, New York, New York (1949) pp. 302-315.

Structure and Properties of Aluminum Nitride and AlON Ceramics, Army Research Laboratory, McCauley, James W., May 2002, 30 pages.

May 1, 2014—PCT_Search_Report_and_Written_Opinion.

Martensson, Per, "Influence of the concentration of ZrCl4 on texture, morphology and growth rate of CVD grown α-Al2O3 coatings deposited by the AlCl3/ZrCl4/H2/CO2/H2S process", Mar. 15, 2006, p. 3626-3632.

* cited by examiner

US 9,017,809 B2

COATINGS FOR CUTTING TOOLS

FIELD

The present invention relates to coatings for cutting tools and, in particular, to coatings deposited by chemical vapor deposition (CVD).

BACKGROUND

Cutting tools, including cemented carbide cutting tools, have been used in both coated and uncoated conditions for machining various metals and alloys. In order to increase cutting tool wear resistance, performance and lifetime, one or more layers of refractory material have been applied to cutting tool surfaces. TiC, TiCN, TiN and/or $Al_2O_3$, for example, have been applied to cemented carbide substrates by CVD and by physical vapor deposition (PVD). While effective in inhibiting wear and extending tool lifetime in a variety of applications, refractory coatings based on single or multilayer constructions of the foregoing refractory materials have increasingly reached their performance limits, thereby calling for the development of new coating architectures for cutting tools.

SUMMARY

In one aspect, cutting tools are described having coatings adhered thereto which, in some embodiments, can demonstrate desirable wear resistance and increased cutting lifetimes. A coated cutting tool, in some embodiments, comprises a substrate and a coating adhered to the substrate, the coating comprising at least one composite layer deposited by chemical vapor deposition comprising an aluminum oxynitride phase and a metal oxide phase, the metal oxide phase including at least one oxide of a metallic element selected from Group IVB of the Periodic Table. The metal oxide phase of a composite layer, in some embodiments, comprises a plurality of oxides of metallic elements selected from Group IVB of the Periodic Table. Moreover, a composite layer of a coating described herein can further comprise a metal oxynitride phase in addition to the aluminum oxynitride and metal oxide phases, the metal oxynitride phase comprising at least one oxynitride of a metallic element selected from Group IVB of the Periodic Table.

In another aspect, methods of making coated cutting tools are described herein. A method of making a coated cutting tool, in some embodiments, comprises providing a substrate and depositing over the substrate by chemical vapor deposition at least one composite layer of a coating, the composite layer comprising an aluminum oxynitride phase and a metal oxide phase, wherein the metal oxide phase includes at least one oxide of a metallic element selected from Group IVB of the Periodic Table. The metal oxide phase, in some embodiments, comprises a plurality of oxides of metallic elements selected from Group IVB of the Periodic Table. Further, the deposited composite layer can also comprise a metal oxynitride phase in addition to the aluminum oxynitride and metal oxide phases, the metal oxynitride phase comprising at least one oxynitride of a metallic element selected from Group IVB of the Periodic Table.

These and other embodiments are described further in the detailed description which follows.

DETAILED DESCRIPTION

Figure 1:
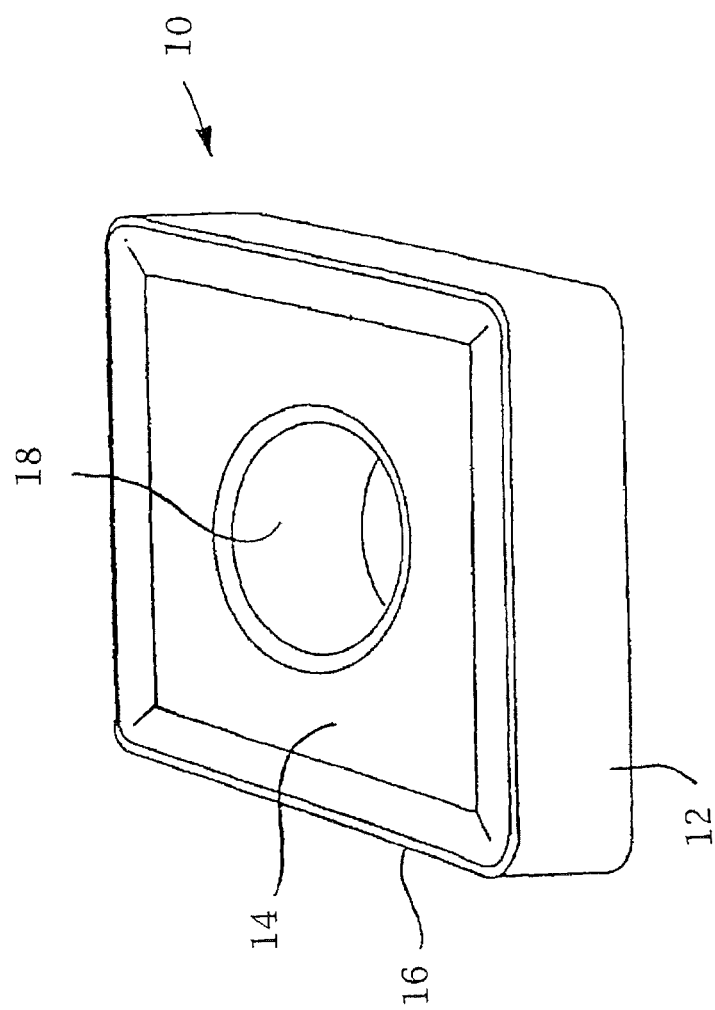
FIG. 1 illustrates a substrate of a coated cutting tool according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coated Cutting Tools

In one aspect, cutting tools are described having coatings adhered thereto which, in some embodiments, can demonstrate desirable wear resistance and increased cutting lifetimes. A coated cutting tool, in some embodiments, comprises a substrate and a coating adhered to the substrate, the coating comprising at least one composite layer deposited by chemical vapor deposition comprising an aluminum oxynitride phase and a metal oxide phase, the metal oxide phase including at least one oxide of a metallic element selected from Group IVB of the Periodic Table. The metal oxide phase of a composite layer can comprise a plurality of oxides of metallic elements selected from Group IVB of the Periodic Table. Moreover, a composite layer of a coating described herein can further comprise a metal oxynitride phase in addition to the aluminum oxynitride and metal oxides phases, the metal oxynitride phase comprising at least one oxynitride of a metallic element selected from Group IVB of the Periodic Table. Groups of the Periodic Table described herein are identified according to the CAS designation.

Turning now to specific components, a coated cutting tool described herein comprises a substrate. Substrates of coated cutting tools can comprise any material not inconsistent with the objectives of the present invention. In some embodiments, a substrate comprises cemented carbide, carbide, ceramic, cermet or steel.

A cemented carbide substrate, in some embodiments, comprises tungsten carbide (WC). WC can be present in a substrate in an amount of at least about 70 weight percent. In some embodiments, WC is present in a substrate in an amount of at least about 80 weight percent or in an amount of at least about 85 weight percent. Additionally, metallic binder of a cemented carbide substrate can comprise cobalt or cobalt alloy. Cobalt, for example, can be present in a cemented carbide substrate in an amount ranging from about 3 weight percent to about 15 weight percent. In some embodiments, cobalt is present in a cemented carbide substrate in an amount ranging from about 5 weight percent to about 12 weight percent or from about 6 weight percent to about 10 weight percent. Further, a cemented carbide substrate may exhibit a zone of binder enrichment beginning at and extending inwardly from the surface of the substrate.

A cemented carbide substrate can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with the WC in the substrate. The substrate, in some embodiments, comprises one or more solid solution carbides in an amount ranging from about 0.1 weight percent to about 5 weight percent. Additionally, a cemented carbide substrate can comprise nitrogen.

In some embodiments, a substrate of a coated cutting tool described herein comprises one or more cutting edges formed at the juncture of a rake face and flank faces of the substrate. FIG. 1 illustrates a substrate of a coated cutting tool according to one embodiment described herein. As illustrated in FIG. 1, the substrate (10) has cutting edges (12) formed at the junction of the substrate rake face (14) and flank faces (16). The substrate also comprises an aperture (18) operable to secure the substrate (10) to a tool holder.

In some embodiments, a substrate of a coated cutting tool is an insert, drill bit, saw blade or other cutting apparatus.

As described herein, a coating adhered to the substrate comprises at least one composite layer deposited by chemical vapor deposition comprising an aluminum oxynitride (AlON) phase and a metal oxide phase including at least one oxide of a metallic element selected from Group IVB of the Periodic Table. The AlON phase can be present in the composite layer in any amount not inconsistent with the objectives of the present invention. The AlON phase, for example, can be the major phase of the composite layer serving as a matrix for the metal oxide and metal oxynitride phases discussed further herein. In some embodiments, the AlON phase is present in the composite layer in an amount selected from Table I.

TABLE I

| AlON Phase of Composite Layer (Volume Percent) |
| --- |
| AlON Phase (vol. %) |
| ≥50 |
| ≥60 |
| ≥70 |
| ≥80 |
| 85-99 |
| 90-99 |

The aluminum, nitrogen and oxygen contents of an AlON phase described herein can be varied according to the CVD parameters selected. Aluminum of the AlON phase, for example, can range from 20 to 50 atomic %. In some embodiments, aluminum of the AlON phase is in the range of 25 to 40 atomic % or 32 to 38 atomic %. Nitrogen of the AlON phase can range from 40 to 70 atomic %. In some embodiments, nitrogen of the AlON phase is in the range of 55 to 70 atomic % or 63 to 67 atomic percent. Further, oxygen of the AlON phase can range from 1 to 20 atomic %. In some embodiments, oxygen of the AlON phase is in the range of 2 to 15 atomic % or 4 to 6 atomic %.

The AlON phase, in some embodiments, is polycrystalline. For example, the AlON phase can display a hexagonal crystalline structure, cubic crystalline structure or mixture of hexagonal and cubic crystalline structures. Alternatively, the AlON phase is amorphous. Further, the AlON phase can display a mixture of crystalline and amorphous structures, wherein the crystalline structures are hexagonal, cubic or a combination thereof. The AlON phase, in some embodiments, demonstrates a fine grain structure with grains having sizes in the range of 10 nm to 2 µm.

As described herein, the composite layer also comprises a metal oxide phase including at least one oxide of a metallic element selected from Group IVB of the Periodic Table. The metal oxide phase, for example, can comprise $ZrO_2$ or $HfO_2$. The metal oxide phase of a composite layer, in some embodiments, comprises a plurality of oxides of metallic elements selected from Group IVB of the Periodic Table. The metal oxide phase, for example, can comprise a mixture of $ZrO_2$ and $HfO_2$.

In some embodiments, the metal oxides phase is a minor phase of the composite layer being contained or dispersed in the AlON matrix phase. In some embodiments, the metal oxide phase is present in the composite layer in an amount selected from Table II.

TABLE II

| Metal Oxide Phase of Composite Layer (Volume Percent) |
| --- |
| Metal Oxide Phase (Vol. %) |
| 1-15 |
| 2-12 |
| 3-10 |

The metal oxide phase, in some embodiments, is polycrystalline. For example, the metal oxide phase can display a cubic crystalline structure, monoclinic crystalline structure or tetragonal crystalline structure or mixtures thereof. The metal oxide phase, in some embodiments, demonstrates a fine grain structure with grains having sizes in the range of 10 nm to 2 µm. Grains of the metal oxide phase, in some embodiments, have a spherical or elliptical geometry.

The composite layer of a coating described herein can further comprise a metal oxynitride phase in addition to the AlON and metal oxides phases, the metal oxynitride phase comprising at least one oxynitride of a metallic element selected from Group IVB of the Periodic Table. The metal oxynitride phase, for example, can comprise titanium oxynitride (TiON). In some embodiments, the metal oxynitride phase comprises a plurality of oxynitrides of metallic elements selected from Group IVB. A metal oxynitride phase, in some embodiments, is of the formula $MO_xN_{1-x}$, wherein M is selected from metallic elements of Group IVB of the Periodic Table and x=0.1-0.9.

The metal oxynitride phase, in some embodiments, is polycrystalline. In such embodiments, the metal oxynitride phase can demonstrate a cubic crystalline structure. Further, the metal oxynitride phase can demonstrate an ultrafine grain structure with grains having sizes in the range of 1 nm to 20 nm.

The metal oxynitride phase, in some embodiments, is a minor phase of the composite layer being contained or dispersed in the AlON matrix phase. In some embodiments, for example, the metal oxynitride phase is present in the composite layer in an amount selected from Table III.

TABLE III

| Metal Oxynitride Phase of the Composite Layer (Volume Percent) |
| --- |
| Metal Oxynitride Phase (Vol. %) |
| 0-10 |
| 0.5-10 |
| 1-9 |
| 2-8 |

The volume percentages of the AlON phase, metal oxide phase and metal oxynitride phase of a composite layer described herein can be determined using glow discharge optical emission spectroscopy (GDOES) and energy dispersive X-ray spectroscopy (EDX/EDS). In one embodiment, for example, the composition of a coating composite layer described herein can be analyzed by GDOES using GDA750 Glow Discharge Spectrometer (Spectrum Analytic Ltd. of Hof, Germany) with spot diameter of 1.0 mm. The sputtered material removal for analysis can be administered with 0.5 µm steps from the top of the coating to the substrate side. Further, additional analysis of a coating composite layer described herein can be conducted by EDS using scanning electron microscopy equipment LEO 430i (LEO Ltd. of Oberkochen, Germany) with analysis system of LINK ISIS (Oxford Ltd.)

For phase analysis/characterization of coated cutting tools described herein, diffractometer type D5000 (Siemens) with Bragg-Brentano graizing-incidenz system and X-ray Cu Kα with Ni filter (λ 0.01578 nanometers) can be used with operating parameters of 40 KV and 40 MA.

Further, a composite layer of a coating described herein can have any thickness not inconsistent with the objectives of the present invention. In some embodiments, a composite layer has a thickness selected from Table IV.

TABLE IV

| Composite Layer Thickness (µm) |
| Composite Layer Thickness (µm) |
| --- |
| 0.5-15 |
| 1-12 |
| 1.5-10 |
| 2.5-8 |

A composite layer, in some embodiments, is deposited directly on the cutting tool substrate surface. Alternatively, a coating described herein can further comprise one or more inner layers between the composite layer and the substrate. One or more inner layers, in some embodiments, comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more inner layers between the substrate and composite layer comprise a carbide, nitride, carbonitride, oxide or boride of one or more metallic elements selected from the group consisting of aluminum and metallic elements of Groups IVB, VB and VIB of the Periodic Table. For example, one or more inner layers are selected from the group consisting of titanium nitride, titanium carbonitride, titanium carbide, titanium oxide, zirconium oxide, zirconium nitride, zirconium carbonitride, hafnium nitride, hafnium carbonitride and alumina and mixtures thereof.

Inner layers of coatings described herein can have any thickness not inconsistent with the objectives of the present invention. An inner layer of a coating can have a thickness ranging from 0.5 µm to 12 µm. In some embodiments, the thickness of an inner layer is selected according to the position of the inner layer in the coating. An inner layer deposited directly on a surface of the substrate as an initial layer of the coating, for example, can have a thickness ranging from 0.5 to 2.5 µm. An inner layer deposited over the initial layer, such as a TiCN layer, can have a thickness ranging from 2 µm to 12 µm. Further, an inner layer on which a composite layer described herein is deposited, such as a layer comprising alumina, can have a thickness ranging from 1 to 6 µm.

In some embodiments, a composite layer described herein is the outermost layer of the coating. Alternatively, a coating described herein can comprise one or more outer layers over the composite layer. One or more outer layers, in some embodiments, comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers over the composite layer comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium carbide, zirconium nitride, zirconium carbonitride, hafnium nitride, hafnium carbonitride and alumina and mixtures thereof.

Outer layers of coatings described herein can have any thickness not inconsistent with the objectives of the present invention. An outer layer of a coating, in some embodiments, can have a thickness ranging from 0.5 µm to 5 µm.

Additionally, in some embodiments, a coating described herein can comprise one or more bonding layers. A bonding layer can demonstrate various positions in a coating described herein. In some embodiments, a bonding layer is disposed between two inner layers of the coating, such as between a titanium nitride or titanium carbonitride inner layer and an inner layer comprising alumina. A bonding layer can also be disposed between an inner layer and a composite layer described herein. Further, a bonding layer can be disposed between a composite layer and an outer layer of the coating. In some embodiments, bonding layers are used to increase adhesion between layers of the coating and/or nucleate the desired morphology of a coating layer deposited on the bonding layer. A bonding layer, in some embodiments, is of the formula $M(O_xC_yN_z)$, wherein M is a metal selected from the group consisting of metallic elements of Groups IVB, VB and VIB of the Periodic Table and x≥0, y≥0 and z≥0 wherein x+y+z=1. For example, in one embodiment, a bonding layer of TiC is employed between an inner layer of TiCN and an inner layer comprising alumina.

A bonding layer of the formula $M(O_xC_yN_z)$ can have any thickness not inconsistent with the objectives of the present invention. In some embodiments, a $M(O_xC_yN_z)$ layer has a thickness of about 0.5 µm. Moreover, a $M(O_xC_yN_z)$ layer can have a thickness ranging from 0.5 µm to 5 µm.

A coating adhered to a substrate can have any architecture of composite layer, inner layer(s) and/or outer layer(s) described herein. In some embodiments, a coating described herein has an architecture selected from Table V.

TABLE V

| Coating Architectures | | |
| --- | --- | --- |
| Inner Layer(s) | Composite Layer | Outer Layer |
| TiN | AlON/ZrO$_2$ | — |
| TiN | AlON/ZrO$_2$/TiON | — |
| TiN | AlON/ZrO$_2$/TiON | ZrN |
| TiN | AlON/ZrO$_2$/TiON | ZrCN |
| TiN—TiCN(MT)* | AlON/ZrO$_2$/TiON | — |
| TiN—TiCN(MT) | AlON/ZrO$_2$/TiON | ZrN |
| TiN—TiCN(MT)-Al$_2$O$_3$/ZrO$_2$/TiO$_x$ | AlON/ZrO$_2$/TiON | — |
| TiN—TiCN(MT) | AlON/ZrO$_2$/TiON | Al$_2$O$_3$/ZrO$_2$/TiO$_x$ |
| TiN—TiCN(MT)-Al$_2$O$_3$/ZrO$_2$/TiO$_x$ | AlON/ZrO$_2$/TiON | ZrN |
| TiN—TiCN(MT)-Al$_2$O$_3$ | AlON/ZrO$_2$/TiON | — |

TABLE V-continued

Coating Architectures

| Inner Layer(s) | Composite Layer | Outer Layer |
|---|---|---|
| TiN—TiCN(MT) | AlON/ZrO$_2$/TiON | Al$_2$O$_3$ |
| TiN—TiCN(MT) | (AlON/ZrO$_2$/TiON—ZrN)** | |

*MT = Medium Temperature CVD
**Multiple Layer

In some embodiments wherein a coating described herein comprises alumina in an inner layer and/or outer layer, the alumina can be alpha-alumina, kappa-alumina or mixtures of alpha and kappa-alumina.

A coating having a construction described herein, in some embodiments, has a hardness (HV0.05) ranging from about 1500 to 2500, wherein HV0.05 refers to Vickers Hardness using a 0.05 kilogram-force load. In some embodiments, a coating has a hardness ranging from about 1700 HV0.05 to 2200 HV0.05. Vickers hardness values recited herein are determined according to ASTM E 384, "Standard Method for Knoop and Vickers Hardness of Materials," ASTM International.

Additionally, a coating described herein can demonstrate a critical load ($L_c$) up to about 90 N. $L_c$ values for coatings described herein were determined according to ASTM C1624-05—Standard Test for Adhesion Strength by Quantitative Single Point Scratch Testing wherein a progressive loading of 10 N was used.

Further, coatings described herein can demonstrate low residual tensile stress or low to moderate residual compressive stress in the as-deposited state. Post coat blasting, in some embodiments, can increase residual compressive stresses of the coating. Post coat blasting can be administered in any desired manner. In some embodiments, post coat blasting comprises shot blasting or pressure blasting. Pressure blasting can be administered in a variety of forms including compressed air blasting, wet compressed air blasting, pressurized liquid blasting, wet blasting, pressurized liquid blasting and steam blasting.

In one embodiment, for example, post coat treatment of a coating described herein can be administered by dry blasting the coating with alumina and/or ceramic particles. Alternatively, the coating can be wet blasted using a slurry of alumina and/or ceramic particles in water at a concentration of 5 volume percent to 35 volume percent. Alumina and/or ceramic particles of post-coat blasting techniques described herein can have a size distribution of 60 μm to 120 μm. Additionally, blasting pressures can range from 2 bar to 3 bar for a time period of 1 to 15 seconds, wherein the blast nozzle is 2 to 8 inches from the coating surface being blasted. Further, angle of impingement of the alumina and/or ceramic particles can be chosen to range from 45 degrees to 90 degrees.

Post coat blasting can also be administered on coated cutting tools described herein in accordance with the disclosure of U.S. Pat. No. 6,869,334 which is incorporated herein by reference in its entirety.

II. Methods of Making Coated Cutting Tools

In another aspect, methods of making coated cutting tools are described herein. A method of making a coated cutting tool, in some embodiments, comprises providing a substrate and depositing over the substrate by chemical vapor deposition at least one composite layer of a coating, the composite layer comprising an aluminum oxynitride phase and a metal oxide phase, wherein the metal oxide phase includes at least one oxide of a metallic element selected from Group IV of the Periodic Table. The metal oxide phase, in some embodiments, comprises a plurality of oxides of metallic elements selected from Group IV of the Periodic Table. Further, the deposited composite layer can also comprise a metal oxynitride phase in addition to the aluminum oxynitride and metal oxides phases, the metal oxynitride phase comprising at least one oxynitride of a metallic element selected from Group IVB of the Periodic Table.

Turning now to specific steps, a method described herein comprises providing a substrate. A substrate can comprise any substrate recited in Section I hereinabove. In some embodiments, for example, a substrate is cemented carbide, such as cemented tungsten carbide described in Section I herein. Moreover, a composite layer deposited according to methods described herein can have any construction, compositional parameters and/or properties described in Section I herein for a composite layer. In some embodiments, for example, a composite layer comprises an AlON matrix phase in which a metal oxide phase is dispersed, the metal oxide phase comprising at least one oxide of a metallic element selected from Group IV of the Periodic Table. The metal oxide phase can comprise ZrO$_2$, HfO$_2$ or mixtures thereof.

In a method described herein, a composite layer can be deposited from a gaseous mixture comprising an aluminum source, oxygen source, nitrogen source and source for the metallic element of Group IVB. In some embodiments, for example, the aluminum source is AlCl$_3$, and the metallic element source is a Group IVB metal chloride, such as ZrCl$_4$, HfCl$_4$ or mixtures thereof.

Further, as described herein, a composite layer can also comprise a metal oxynitride phase in addition to the AlON and metal oxide phases, wherein the metal of the oxynitride phase is selected from metallic elements of Group IVB of the Periodic Table. In some embodiments, the metal oxynitride phase comprises titanium oxynitride (TiON). Titanium chloride (TiCl$_4$), for example, can be added to the gaseous mixture for the deposition of a TiON phase in the AlON matrix.

Compositional percentages of phases of the composite layer as set forth in Tables I-III herein can be achieved by varying amounts of individual reactant gases in the mixture. Additionally, the compositional percentages of aluminum, nitrogen and oxygen of the AlON phase as set forth in Section I hereinabove can be achieved by varying amounts of individual reactant gases in the mixture. General CVD processing parameters for depositing a composite layer of a coating described herein are provided in Table VI.

TABLE VI

Composite Layer CVD Processing Parameters
Ranges of Processing Parameters for Composite Layer

| | |
|---|---|
| Temperature | 900-1000° C. |
| Pressure | 50-100 mbar |
| Time | 120-300 min. |
| H$_2$ | Balance |
| AlCl$_3$ | 1-4 vol. % |
| MCl$_4$* | 0.5-3 vol. % |
| NH$_3$ | 1-4 vol. % |
| CO$_2$ | 1-5 vol. % |
| HCl | 2-6 vol. % |
| TiCl$_4$** | 0.1-2 vol. % |

*M = Group IVB Metal
**Optional

A composite layer, in some embodiments, is deposited directly on a surface of the substrate. Alternatively, a composite layer is deposited on an inner layer of the coating. An inner layer of the coating can have any construction, compositional parameters and/or properties recited in Section I hereinabove for an inner layer. An inner layer can comprise one or more metallic elements selected from the group consisting of aluminum and one or more metallic elements of Groups IVB, VB, and VIB of the Periodic Table and one or more non-metallic elements selected from the group consisting of metallic elements of Groups IIIA, IVA, VA and VIA of the Periodic Table. In some embodiments, an inner layer is a carbide, nitride, carbonitride, oxide or boride of one or more metallic elements selected from the group consisting of aluminum and metallic elements of Groups IVB, VB and VIB of the Periodic Table. An inner over which a composite layer is deposited, for example, can be selected from the group consisting of titanium nitride, titanium carbide, titanium carbonitride, titanium oxide, zirconium oxide, zirconium nitride, zirconium carbonitride, hafnium nitride, hafnium carbonitride and alumina and mixtures thereof. In one embodiment, for example, an inner layer comprises a mixture of alumina, zirconium oxide and titanium oxide ($Al_2O_3/ZrO_2/TiO_x$).

As with the composite layer, inner layer(s) of a coating described herein can be deposited by CVD. In some embodiments, an inner layer of the coating, such as a TiCN layer, is deposited by medium-temperature (MT) CVD.

Further, methods described herein can also comprise depositing over the composite layer one or more outer layers. Outer layer(s) of a coating described herein, in some embodiments, are deposited by CVD. An outer layer of the coating can have any construction, compositional parameters and/or properties recited in Section I hereinabove for an outer layer. An outer layer can comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table. In some embodiments, one or more outer layers over the composite layer comprise a nitride, carbonitride, oxide or boride of one or more metallic elements selected from the group consisting of aluminum and metallic elements of Groups IVB, VB and VIB of the Periodic Table. For example, one or more outer layers are selected from the group consisting of titanium nitride, titanium carbonitride, titanium carbide, zirconium nitride, zirconium carbonitride, hafnium nitride, hafnium carbonitride and alumina and mixtures thereof.

Additionally, methods of making coated cutting tools described herein can further comprise post coat blasting the deposited coating. Post coat blasting can be administered in any desired manner, including dry blasting and wet blasting techniques. In some embodiments, post coat blasting is administered in a manner described in Section I hereinabove.

Post coat blasting, in some embodiments, can change moderate tensile stress of the coating to moderate compressive stress or increase compressive stress in the as-deposited coating.

These and other embodiments are further illustrated in the following non-limiting examples.

Example 1

Coated Cutting Tool Body

A coated cutting tool described herein was produced by placing a cemented tungsten carbide (WC) cutting insert substrate [ANSI standard geometry HNGJ0905ANSN-GD] into a Bernex 200 CVD reactor. The cutting insert comprised 6 wt. % cobalt binder with the balance WC grains of size 1 to 5 μm. A coating having an architecture described herein was deposited on the cemented WC cutting insert according to the CVD process parameters provided in Tables VII-VIII.

TABLE VII

| | CVD Deposition of Coating | | | | | | | | | |
|---|---|---|---|---|---|---|---|---|---|---|
| Process Step | $H_2$ vol. % | $N_2$ vol. % | $TiCl_4$ vol. % | $CH_3CN$ vol. % | $CH_4$ vol. % | $AlCl_3$ vol. % | $CO_2$ vol. % | $ZrCl_4$ vol. % | $NH_3$ vol. % | HCl vol. % |
| TiN | Bal. | 40-48 | 0.5-2 | — | — | — | — | — | — | — |
| MT-TiCN | Bal. | 25-40 | 0.5-2 | 0.1-1.5 | — | — | — | — | — | — |
| TiC | Bal. | — | 0.5-2 | — | 5-8 | — | — | — | — | — |
| $Al_2O_3/ZrO_2/$ $TiO_x$* | Bal. | — | 0.1-1.5 | — | 3-6 | 1.5-4 | 2-5 | 0.1-1.5 | — | 3-6 |
| $AlON/ZrO_2/$ $TiON$** | Bal. | — | 0.1-1.5 | — | — | 1.5-4 | 2-5 | 0.1-1.5 | 1-4 | 3-6 |

*Layer with mixture of $Al_2O_3$, $ZrO_2$ and TiOx phases
**Composite Layer with mixture of AlON, $ZrO_2$ and TiON phases

TABLE VIII

| CVD Deposition of Coating | | | |
|---|---|---|---|
| Process Step | Temp. °C. | Pressure mbar | Time min. |
| TiN | 930-960 | 600-900 | 20-40 |
| MT-TiCN | 900-940 | 70-100 | 70-110 |
| TiC | 950-1000 | 70-100 | 10-20 |
| $Al_2O_3/ZrO_2/TiO_x$* | 950-1000 | 70-100 | 15-60 |
| $AlON/ZrO_2/TiON$** | 950-1000 | 70-100 | 200-280 |

*Layer with mixture of $Al_2O_3$, $ZrO_2$ and TiOx phases
**Composite Layer with mixture of AlON, $ZrO_2$ and TiON phases The resulting multilayered coating comprising an AlON/$ZrO_2$/TiON composite layer demonstrated the properties provided in Table IX.

TABLE IX

| Properties of CVD Coating | | |
|---|---|---|
| Coating Layer | Thickness (μm) | Hardness (0.05HV) |
| TiN | 0.4 | — |
| MT-TiCN + TiC | 4.2 | — |
| $Al_2O_3/ZrO_2/TiOx$ | 1.6 | 1800 |
| $AlON/ZrO_2/TiON$ | 3.9 | 2000 |

Figure 2:
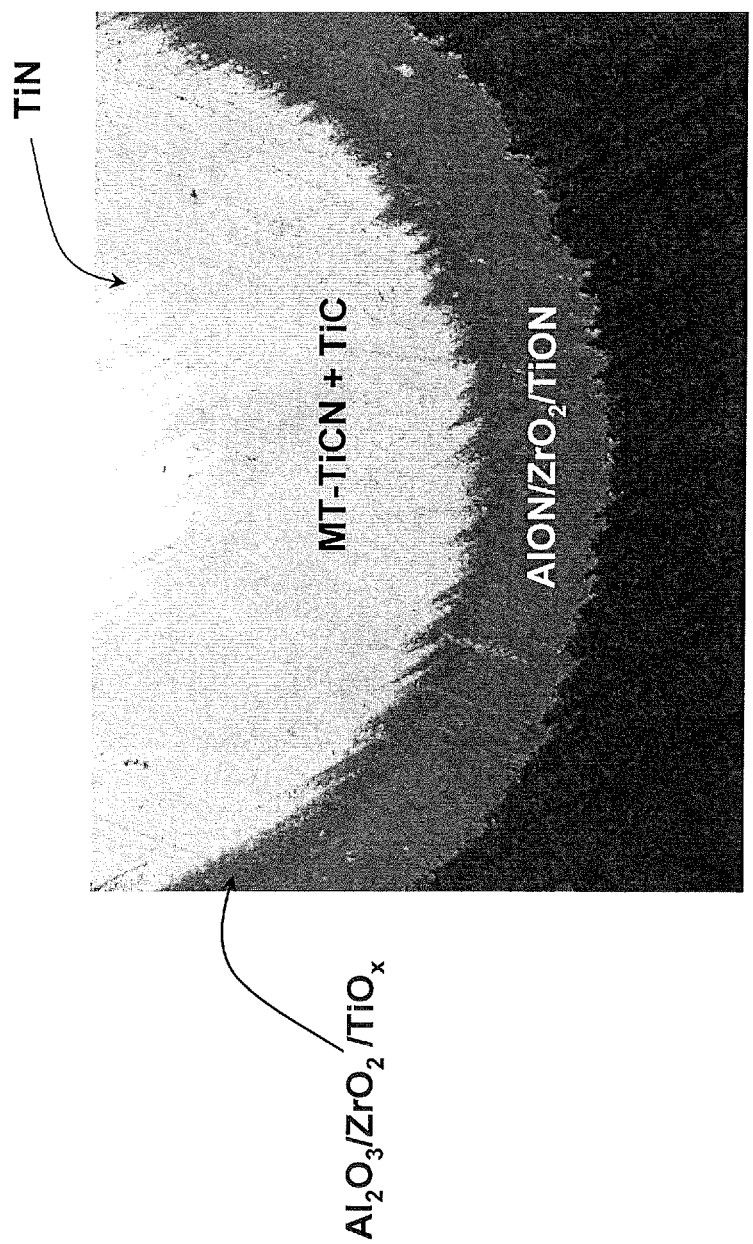
FIG. 2 is a photomicrograph of a section of a coated cutting insert demonstrating layers of the coating architecture according to one embodiment described herein.
Figure 3:
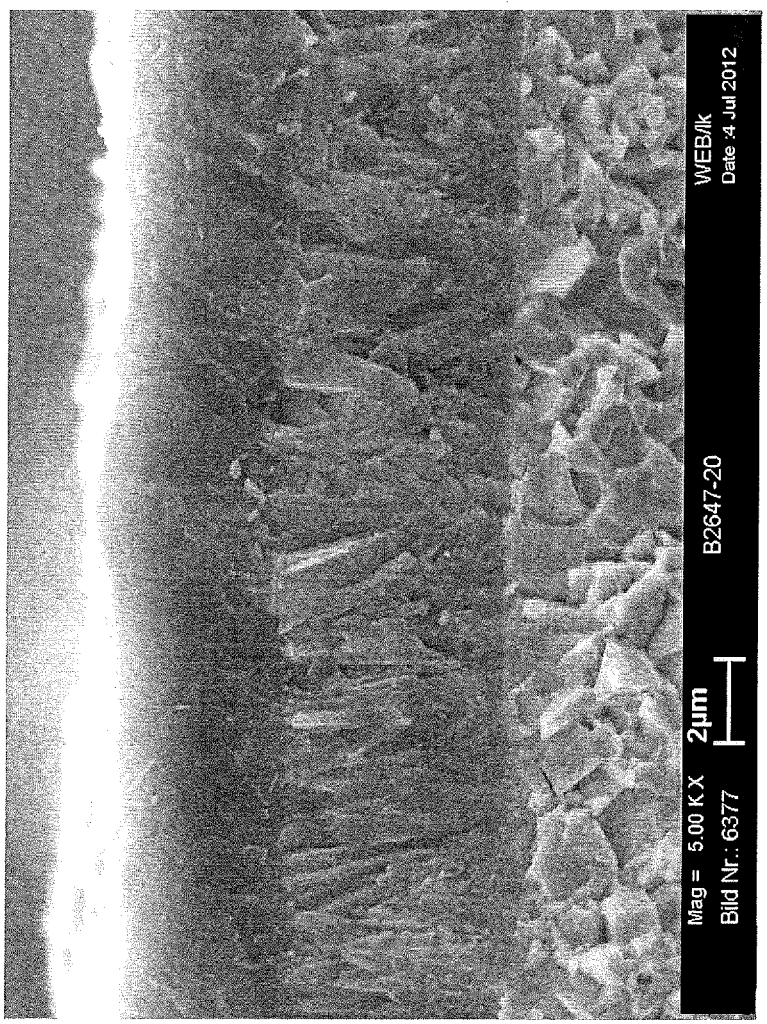
FIG. 3 is a cross-sectional scanning electron microscopy (SEM) image of a coated cutting insert according to one embodiment described herein.
Figure 4:
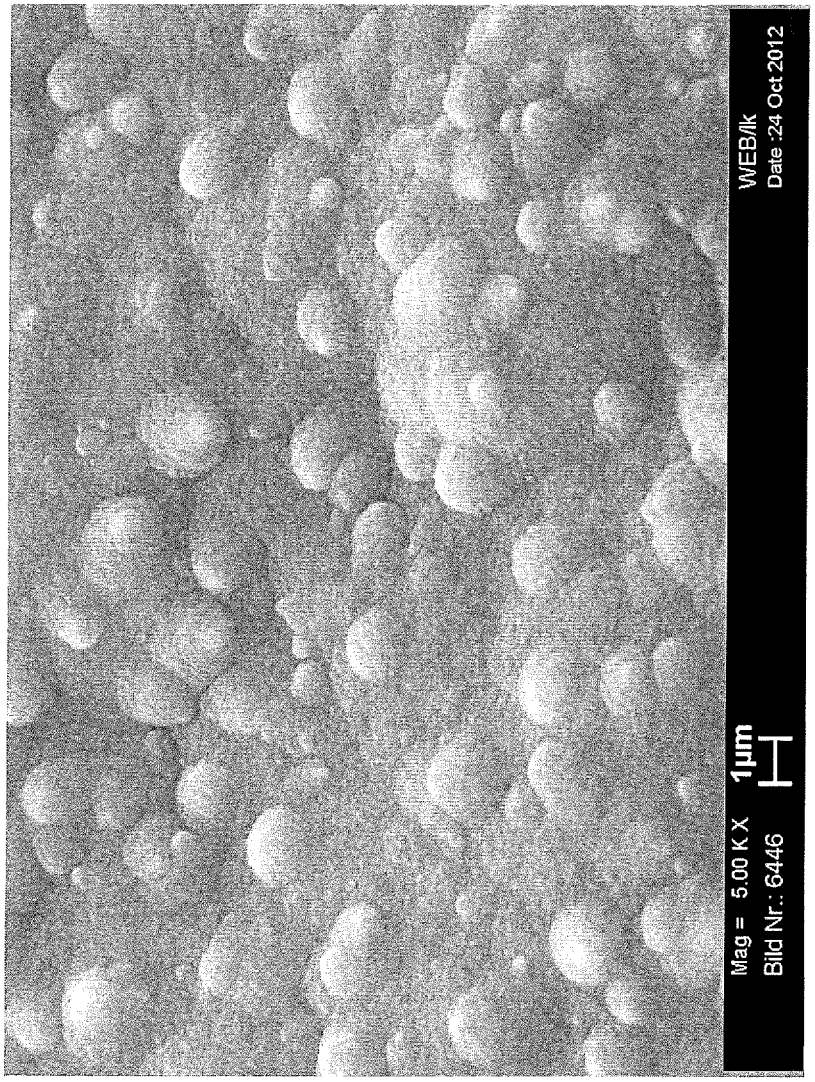
FIG. 4 is a SEM image of a composite layer surface according to one embodiment described herein.

FIG. 2 is a photomicrograph of a section of the coated cutting insert of this Example demonstrating layers of the coating architecture. FIG. 3 is a cross-sectional SEM image of the coated cutting insert at a magnification of 5000×. Additionally, FIG. 4 is a top-down SEM image of the composite layer (AlON/ZrO$_2$/TiON) surface at a magnification of 5000×.

Example 2

Coated Cutting Tool Body

A coated cutting tool described herein was produced by placing a cemented tungsten carbide (WC) cutting insert substrate [ANSI Standard geometry HNGJ0905ANSN-GD] into a Bernex 200 CVD reactor. The cutting insert comprised 6 wt. % cobalt binder with the balance WC grains of size 1 to 5 µm. A coating having an architecture described herein was deposited on the cemented WC cutting insert according to the CVD process parameters provided in Tables X-XI.

TABLE X

| | CVD Deposition of Coating | | | | | | | | | |
|---|---|---|---|---|---|---|---|---|---|---|
| Process Step | H$_2$ vol. % | N$_2$ vol. % | TiCl$_4$ vol. % | CH$_3$CN vol. % | CH$_4$ vol. % | AlCl$_3$ vol. % | CO$_2$ vol. % | ZrCl$_4$ vol. % | NH$_3$ vol. % | HCl vol. % |
| TiN | Bal. | 40-48 | 0.5-2 | — | — | — | — | — | — | — |
| MT-TiCN | Bal. | 25-40 | 0.5-2 | 0.1-1.5 | — | — | — | — | — | — |
| TiC | Bal. | — | 0.5-2 | — | 5-8 | — | — | — | — | — |
| Al$_2$O$_3$/ZrO$_2$/TiOx* | Bal. | — | 0.1-1.5 | — | 3-6 | 1.5-4 | 2-5 | 0.1-1.5 | — | 3-6 |
| AlON/ZrO$_2$** | Bal. | — | — | — | — | 1.5-4 | 2-5 | 0.1-1.5 | 1-4 | 3-6 |

*Layer with mixture of Al$_2$O$_3$, ZrO$_2$ and TiOx phases
**Composite Layer with mixture of AlON and ZrO$_2$ phases

TABLE XI

| | CVD Deposition of Coating | | |
|---|---|---|---|
| Process Step | Temp. ° C. | Pressure mbar | Time min. |
| TiN | 930-960 | 600-900 | 20-40 |
| MT-TiCN | 900-940 | 70-100 | 70-110 |
| TiC | 950-1000 | 70-100 | 10-20 |
| Al$_2$O$_3$/ZrO$_2$/TiOx* | 950-1000 | 70-100 | 15-60 |
| AlON/ZrO$_2$** | 950-1000 | 70-100 | 200-280 |

*Layer with mixture of Al$_2$O$_3$, ZrO$_2$ and TiOx phases
**Composite Layer with mixture of AlON and ZrO$_2$ phases The resulting multilayered coating comprising an AlON/ZrO$_2$ composite layer demonstrated the properties provided in Table XII.

TABLE XII

| Properties of CVD Coating | |
|---|---|
| Coating Layer | Thickness (µm) |
| TiN | 0.6 |
| MT-TiCN + TiC | 5.1 |
| Al$_2$O$_3$/ZrO$_2$/TiOx | 1.3 |
| AlON/ZrO$_2$ | 5.5 |

Example 3

Milling Testing

A coated cutting insert of Example 1 and Comparative coated cutting inserts (1 and 2) were subjected to milling testing according to the parameters below. The Comparative coated cutting inserts (1 and 2) comprised the same cemented WC substrate as Example 1 and had CVD coating architectures as follows:

Comparative 1: TiN—TiCN(MT)-TiC-(α)Al$_2$O$_3$—ZrCN
Comparative 2: TiN—TiCN(MT)-TiC-(α)Al$_2$O$_3$—TiN (TiN outer layer removed by wet blasting)
For the milling testing, two cutting edges were tested for each coated insert of Example 1, Comparative 1 and Comparative 2.
Milling Parameters
Workpiece—GGG 70
Cutting Speed—300 m/min
Feed per tooth—0.25 mm
Axial Depth of Cut—2 mm
Radial Depth of Cut—60 mm
Coolant—No The average milling lengths (mm) until end of life (EOL) of the coated inserts are provided in Table XIII. EOL was registered by failure modes of flank wear (VB)>0.3 mm and/or microchipping on the cutting edge determined by visual inspection.

TABLE XIII

| Milling Test Results (Length - mm) | | | |
|---|---|---|---|
| Coated Cutting Insert | Cutting Edge 1 | Cutting Edge 2 | Average |
| Example 1 | 5500 | 5500 | 5500 |
| Comparative 1 [TiN—TiCN(MT)-TiC—(α)Al$_2$O$_3$—ZrCN] | 4500 | 4500 | 4500 |
| Comparative 2 [TiN—TiCN—TiC—(α)Al$_2$O$_3$—TiN] | 4500 | 3500 | 4000 |

As provided in Table XIII, the coated cutting insert of Example 1 having coating architecture described herein outperformed the comparative inserts demonstrating at least a 20 percent increase in lifetime.

Example 4

Milling Testing

Cemented WC substrates D and E having ANSI standard geometry HNGX0905160-MR were provided coatings in accordance with Examples 1 and 2 as set forth in Table XIV. Cemented WC substrate F having ANSI standard geometry HNGX0905160-MR was provided a comparative CVD coating as set forth in Table XIV. Cemented WC substrates of D, E and F comprised cobalt binder in an amount of 6.1 weight percent with the balance being WC particles having grain sizes of less than 1 µm to 2 µm.

TABLE XIV

| Coated Cutting Inserts | |
|---|---|
| Coated Cutting Insert | CVD Coating Architecture |
| D | TiN—TiCN(MT)-TiC—$Al_2O_3$/$ZrO_2$/$TiO_x$—AlON/$ZrO_2$/TiON |
| E | TiN—TiCN(MT)-TiC—$Al_2O_3$/$ZrO_2$/$TiO_x$—AlON/$ZrO_2$ |
| F | TiN—TiCN(MT)-TiC—(α) $Al_2O_3$ |

Two cutting edges were tested for each coated insert D-F according to the following milling parameters.
Milling Parameters
Workpiece—GGG 70
Cutting Speed—300 m/min
Feed per tooth—0.2 mm
Axial Depth of Cut—1.5 mm
Radial Depth of Cut—60 mm
Coolant—No The average milling lengths (mm) until EOL of coated inserts D-F are provided in Table XV. EOL was registered by failure modes of flank wear (VB)>0.3 mm and/or microchipping on the cutting edge determined by visual inspection.

TABLE XV

| Milling Test Results (Length - mm) | | | |
|---|---|---|---|
| Coated Cutting Insert | Cutting Edge 1 | Cutting Edge 2 | Average |
| D | 4000 | 4000 | 4000 |
| E | 3000 | 3500 | 3250 |
| F | 4000 | 3500 | 3750 |

As provided in Table XV, inserts D and E comprising coating architectures described herein demonstrated similar or increased lifetimes relative to the comparative α-alumina coated insert F.

Example 5

Milling Testing

Cemented WC substrate G having ANSI standard geometry HNGX090516(0)-MR was provided a coating in accordance with Example 1 as set forth in Table XVI. Cemented WC substrates H and I having ANSI standard geometry HNGX090516(0)-MR were each provided a comparative CVD coating as set forth in Table XVI. Cemented WC substrates of G, H and I comprised cobalt binder in an amount of 6.1 weight percent with the balance being WC particles having grain sizes of less than 1 μm to 2 μm.

TABLE XVI

| Coated Cutting Inserts | |
|---|---|
| Coated Cutting Insert | CVD Coating Architecture |
| G | TiN—TiCN(MT)-TiC—$Al_2O_3$/$ZrO_2$/$TiO_x$—AlON/$ZrO_2$/TiON |
| H | TiN—TiCN(MT)-TiC—$Al_2O_3$/$ZrO_2$/$TiO_x$—AlON |
| I | TiN—TiCN(MT)-TiC—(α) $Al_2O_3$ |

Two cutting edges were tested for each coated insert G-I according to the following milling parameters.
Milling Parameters
Workpiece—GGG 70
Cutting Speed—300 m/min
Feed per tooth—0.2 mm
Axial Depth of Cut—1.5 mm
Radial Depth of Cut—60 mm
Coolant—No The average milling lengths (mm) until EOL of coated inserts G-I are provided in Table XVII. EOL was registered by failure modes of flank wear (VB)>0.3 mm and/or microchipping on the cutting edge determined by visual inspection.

TABLE XVII

| Milling Test Results (Length - mm) | | | |
|---|---|---|---|
| Coated Cutting Insert | Cutting Edge 1 | Cutting Edge 2 | Average |
| G | 3500 | 4500 | 4000 |
| H | 3000 | 3500 | 3250 |
| I | 3500 | 3500 | 3500 |

As provided in Table XVII, insert G comprising a coating architecture described herein outperformed the comparative inserts H and I demonstrating increased milling lifetime.

Example 6

Milling Testing

Cemented WC substrate J having ANSI standard geometry HNGJ0905ANSNGD was provided a coating in accordance with Example 1 as set forth in Table XVIII. Cemented WC substrate K having ANSI standard geometry HNGJ0905ANSNGD was provided a comparative CVD coating as set forth in Table XVIII. Cemented WC substrates of J and K comprised cobalt binder in an amount of 6.1 weight percent with the balance being WC particles having grain sizes of less than 1 μm to 2 μm.

TABLE XVIII

| Coated Cutting Inserts | |
|---|---|
| Coated Cutting Insert | CVD Coating Architecture |
| J | TiN—TiCN(MT)-TiC—$Al_2O_3$/$ZrO_2$/$TiO_x$—AlON/$ZrO_2$/TiON |
| K | TiN—TiCN(MT)-TiC—$Al_2O_3$/$ZrO_2$/$TiO_x$ |

Two cutting edges were tested for each coated insert J and K according to the following milling parameters.
Milling Parameters
Workpiece—GGG 70
Cutting Speed—300 m/min
Feed per tooth—0.25 mm
Axial Depth of Cut—2 mm
Radial Depth of Cut—60 mm
Coolant—No The average milling lengths (mm) until EOL of coated inserts J and K are provided in Table XIX. EOL was registered by failure modes of flank wear (VB)>0.3 mm and/or microchipping on the cutting edge determined by visual inspection.

TABLE XIX

Milling Test Results (Length - mm)

| Coated Cutting Insert | Cutting Edge 1 | Cutting Edge 2 | Average |
|---|---|---|---|
| J | 5000 | 4500 | 4750 |
| K | 2500 | 2000 | 2250 |

As provided in Table XIX, insert J comprising a coating architecture described herein outperformed the comparative insert K, demonstrating an average lifetime in excess of 2× the lifetime of insert K.

Example 7

Milling Testing

Cemented WC substrate L having ANSI standard geometry HNGJ0905ANSNGD was provided a coating in accordance with Example 1 as set forth in Table XX. Cemented WC substrate M having ANSI standard geometry HNGJ0905ANSNGD was provided a comparative CVD coating as set forth in Table XX. Cemented WC substrates of L and M comprised cobalt binder in an amount of 12.2 weight percent with the balance being WC particles having grain sizes of less than 1 μm to 3 μm.

TABLE XX

Coated Cutting Inserts

| Coated Cutting Insert | Coating Architecture |
|---|---|
| L | TiN—TiCN(MT)-TiC—$Al_2O_3$/$ZrO_2$/$TiO_x$—AlON/$ZrO_2$/TiON |
| M | TiN—TiCN(MT)-TiC—(κ)$Al_2O_3$ |

Two cutting edges were tested of each coated insert L and M according to the following milling parameters.
Milling Parameters
Workpiece—42CrMo4V
Cutting Speed—200 m/min
Feed per tooth—0.3 mm
Axial Depth of Cut—2 mm
Radial Depth of Cut—120 mm
Coolant—No
The average milling lengths (mm) until EOL of coated inserts L and M are provided in Table XXI. EOL was registered by failure modes of flank wear (VB)>0.3 mm and/or microchipping on the cutting edge determined by visual inspection.

TABLE XXI

Milling Test Results (Length - mm)

| Coated Cutting Insert | Cutting Edge 1 | Cutting Edge 2 | Average |
|---|---|---|---|
| L | 9200 | 10,800 | 10,000 |
| M | 4400 | 6400 | 5400 |

As provided in Table XXI, insert L comprising a coating architecture described herein outperformed comparative insert M, demonstrating an average lifetime nearly 2× that of κ-alumina coated insert M.

Example 8

Milling Testing

Cemented WC substrate N having ANSI standard geometry HNGJ0905ANSNGD was provided a coating in accordance with Example 1 as set forth in Table XXII. Cemented WC substrate P having ANSI standard geometry HNGJ0905ANSNGD was provided a comparative CVD coating as set forth in Table XXII. Cemented WC substrates of N and P comprised cobalt binder in an amount of 12.2 weight percent with the balance being WC particles having grain sizes of less than 1 μm to 3 μm.

TABLE XXII

Coated Cutting Inserts

| Coated Cutting Insert | CVD Coating Architecture |
|---|---|
| N | TiN—TiCN(MT)-TiC—$Al_2O_3$/$ZrO_2$/$TiO_x$—AlON/$ZrO_2$/TiON |
| P | TiN—TiCN(MT)-TiC—(κ)$Al_2O_3$ |

Two cutting edges were tested for each coated insert N and P according to the following milling parameters.
Milling Parameters
Workpiece—C45EN
Cutting Speed—300 m/min
Feed per tooth—0.25 mm
Axial Depth of Cut—2 mm
Radial Depth of Cut—62.5 mm
Coolant—No
The average milling lengths (mm) until EOL of coated inserts N and P are provided in Table XXIII. EOL was registered by failure modes of flank wear (VB)>0.3 mm and/or microchipping on the cutting edge determined by visual inspection.

TABLE XXIII

Milling Test Results (Length - mm)

| Coated Cutting Insert | Cutting Edge 1 | Cutting Edge 2 | Average |
|---|---|---|---|
| N | 16,200 | 14,400 | 15,300 |
| P | 12,600 | 12,000 | 12,300 |

As provided in Table XXIII, insert N comprising a coating architecture described herein outperformed the comparative insert P, demonstrating a 16% increase in lifetime over insert P.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:
1. A coated cutting tool comprising:
a substrate; and
a coating adhered to the substrate, the coating comprising at least one composite layer deposited by chemical vapor deposition comprising an aluminum oxynitride phase and a metal oxide phase dispersed in the aluminum oxynitride phase, the metal oxide phase comprising at least one oxide of a metallic element selected from Group IVB of the Periodic Table.

2. The coated cutting tool of claim 1, wherein the metal oxide phase comprises $ZrO_2$, $HfO_2$ or mixtures thereof.

3. The coated cutting tool of claim 1 further comprising a metal oxynitride phase in addition to the aluminum oxynitride and metal oxide phases, the metal oxynitride phase comprising at least one oxynitride of a metallic element selected from Group IVB of the Periodic Table.

4. The coated cutting tool of claim 3, wherein the metal oxynitride phase comprises TiON.

5. The coated cutting tool of claim 3, wherein the metal oxynitride phase is dispersed in the aluminum oxynitride phase.

6. The coated cutting tool of claim 1, wherein the aluminum oxynitride phase comprises a hexagonal crystalline structure, cubic crystalline structure or an amorphous structure or mixtures thereof.

7. The coated cutting tool of claim 1, wherein the aluminum oxynitride phase comprises aluminum in an amount of 20 to 50 atomic percent, nitrogen in an amount of 40 to 70 atomic percent and oxygen in an amount of 1 to 20 atomic percent.

8. The coated cutting tool of claim 1, wherein the aluminum oxynitride phase is present in the composite layer in an amount of 80 volume percent to 99 volume percent.

9. The coated cutting tool of claim 1, wherein the metal oxide phase comprises a cubic, monocline or tetragonal crystalline structure or mixtures thereof.

10. The coated cutting tool of claim 1, wherein the coating further comprises one or more inner layers between the composite layer and substrate.

11. The coated cutting tool of claim 10, wherein the one or more inner layers comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

12. The coated cutting tool of claim 10, wherein the one or more inner layers comprise a carbide, nitride, carbonitride, oxide or boride of a metallic element selected from the group consisting of aluminum and metallic elements of Groups IVB, VB and VIB of the Periodic Table.

13. The coated cutting tool of claim 1, wherein the coating further comprises one or more outer layers over the composite layer.

14. The coated cutting tool of claim 13, wherein the one or more outer layers comprise one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

15. The coated cutting tool of claim 1, wherein the coating further comprises one or more inner layers between the substrate and the composite layer, an inner layer comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table and one or more outer layers over the composite layer, an outer layer comprising one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA and VIA of the Periodic Table.

16. The coated cutting tool of claim 1, wherein the substrate is cemented carbide, cermet or ceramic based on $Si_3N_4$, $Al_2O_3$ or $ZrO_2$ or mixtures thereof.

17. The coated cutting tool of claim 1, wherein the aluminum oxynitride phase is present in the composite layer in an amount greater than 50 volume percent.

18. The coated cutting tool of claim 1, wherein the aluminum oxynitride phase is present in the composite layer in an amount greater than 60 volume percent.

19. The coated cutting tool of claim 1, wherein grains of the aluminum oxynitride phase have sizes in the rage of 10 nm to 2 μm.

20. The coated cutting tool of claim 1, wherein grains of the metal oxide phase have a spherical or elliptical geometry.

21. The coated cutting tool of claim 1, wherein the metal oxide phase is present in the composite layer in an amount of 1 to 15 volume percent.

22. The coated cutting tool of claim 3, wherein the metal oxynitride phase is present in the composite layer in an amount of 0.5 to 10 volume percent.

23. The coated cutting tool of claim 1, wherein the composite layer is deposited on a layer comprising a mixture of alumina, zirconium oxide and titanium oxide.

24. The coated cutting tool of claim 1, wherein the composite layer is deposited on a layer of carbide, nitride or carbonitride of one or more metallic elements selected from Groups IVB, VB and VIB of the Periodic Table.

25. The coated cutting tool of claim 1, wherein grains of the metal oxide phase have sizes in the range of 10 nm to 2 μm.

26. The coated cutting tool of claim 1, wherein the substrate comprises cemented carbide.

* * * * *